(12) United States Patent
Tanaka et al.

(10) Patent No.: US 10,621,490 B2
(45) Date of Patent: Apr. 14, 2020

(54) SEMICONDUCTOR DEVICE

(71) Applicant: Kabushiki Kaisha Toshiba, Minato-ku (JP)

(72) Inventors: Chika Tanaka, Fujisawa (JP); Keiji Ikeda, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 11 days.

(21) Appl. No.: 15/899,390

(22) Filed: Feb. 20, 2018

(65) Prior Publication Data

US 2019/0026628 A1 Jan. 24, 2019

(30) Foreign Application Priority Data

Jul. 20, 2017 (JP) .................. 2017-141298

(51) Int. Cl.
| | | |
|---|---|---|
| *G06N 3/06* | (2006.01) | |
| *G06N 3/063* | (2006.01) | |
| *H01L 27/12* | (2006.01) | |
| *H01L 29/423* | (2006.01) | |
| *G11C 11/4096* | (2006.01) | |

(Continued)

(52) U.S. Cl.
CPC .......... *G06N 3/0635* (2013.01); *G06N 3/063* (2013.01); *G06N 20/00* (2019.01); *G11C 8/16* (2013.01); *G11C 11/405* (2013.01); *G11C 11/4076* (2013.01); *G11C 11/4085* (2013.01); *G11C 11/4091* (2013.01); *G11C 11/4096* (2013.01); *G11C 11/44* (2013.01); *G11C 11/54* (2013.01); *G11C 11/565* (2013.01); *H01L 27/1225* (2013.01); *H01L 27/1255* (2013.01); *H01L 29/42384* (2013.01); *H01L 29/78648* (2013.01); *H01L 29/78696* (2013.01);

(Continued)

(58) Field of Classification Search
None
See application file for complete search history.

(56) References Cited

U.S. PATENT DOCUMENTS 5,165,009 A * 11/1992 Watanabe .............. G06N 3/063
706/41
6,151,244 A * 11/2000 Fujino .................. G11C 11/4074
365/149

(Continued)

FOREIGN PATENT DOCUMENTS

| JP | 2000-222876 | 8/2000 |
|---|---|---|
| JP | 2009-80892 | 4/2009 |

(Continued)

*Primary Examiner* — Douglas King
(74) *Attorney, Agent, or Firm* — Oblon, McClelland, Maier & Neustadt, L.L.P.

(57) ABSTRACT

According to an embodiment, a semiconductor device includes M write word lines, M read word lines, N write bit lines, N read bit lines, N source lines, and M×N cells. The M×N cells are arranged in a matrix including M rows×N columns. A cell in an m-th row×an n-th column includes a first FET, a second FET, and a capacitor. The first FET is connected to an m-th write word line at a gate, to an n-th write bit line at a drain, and to a source of the second FET at a source. The second FET is connected to an m-th read word line at a gate and to an n-th read bit line at a drain. The capacitor is connected to an n-th source line at one end and to the source of the first RET at the other end.

19 Claims, 13 Drawing Sheets

(51) Int. Cl.
    *H01L 29/786*     (2006.01)
    *G11C 11/4076*     (2006.01)
    *G11C 11/408*     (2006.01)
    *G06N 20/00*     (2019.01)
    *G11C 8/16*     (2006.01)
    *G11C 11/4091*     (2006.01)
    *G11C 11/405*     (2006.01)
    *G11C 11/56*     (2006.01)
    *G11C 11/44*     (2006.01)
    *G11C 11/54*     (2006.01)
    *G11C 11/4094*     (2006.01)
    *G06N 3/04*     (2006.01)
    *G06N 3/08*     (2006.01)

(52) U.S. Cl.
    CPC ............ *G06N 3/049* (2013.01); *G06N 3/088* (2013.01); *G11C 11/4094* (2013.01)

(56) References Cited

U.S. PATENT DOCUMENTS

| | | | |
|---|---|---|---|
| 6,181,620 | B1 | 1/2001 | Agata et al. |
| 8,001,065 | B2 | 8/2011 | Tanaka et al. |
| 8,837,202 | B2 | 9/2014 | Takemura |
| 2015/0100532 | A1 | 4/2015 | Yamaguchi |
| 2015/0249096 | A1* | 9/2015 | Lupino ............. H01L 27/11898 257/203 |
| 2016/0343452 | A1 | 11/2016 | Ikeda et al. |
| 2016/0350647 | A1 | 12/2016 | Hosokawa et al. |
| 2018/0277192 | A1 | 9/2018 | Tanaka et al. |

FOREIGN PATENT DOCUMENTS

| | | |
|---|---|---|
| JP | 5789465 | 10/2015 |
| JP | 5858020 | 2/2016 |
| JP | 2016-219011 | 12/2016 |
| JP | 2018-156575 A | 10/2018 |

* cited by examiner

SEMICONDUCTOR DEVICE

CROSS-REFERENCE TO RELATED APPLICATIONS

This application is based upon and claims the benefit of priority from Japanese Patent Application No. 2017-141298, filed on Jul. 20, 2017; the entire contents of which are incorporated herein by reference.

FIELD

Embodiments described herein relate generally to a semiconductor device.

BACKGROUND

There is known a semiconductor device referred to as "neuromorphic device", which simulates a mechanism of neurotransmission in a brain. The neuromorphic device includes a plurality of cells that perform data operation and store data therein. The types of cells in the neuromorphic device include an NVM (non-volatile memory) type and a capacitor type. The capacitor type cell has a difficulty in controlling a leak component.

Further, in the neuromorphic device, control circuits and wires can be reduced by connecting a plurality of cells in a matrix, so as to downscale the neuromorphic device. When data is read in the neuromorphic device in which cells are connected in a matrix, the plurality of cells are connected to one bit line. Therefore, in the neuromorphic device in which the capacitor type cells are connected in a matrix, the cells connected to the same bit line are connected to one another when data is read, so that accumulated charges in the cells are averaged. Therefore, it has been difficult for the neuromorphic device including capacitor type cells to realize downscaling by connecting cells in a matrix.

DETAILED DESCRIPTION

According to an embodiment, a semiconductor device includes M (M is an integer of 1 or more) write word lines including a first write word line to an M-th write word line, M read word lines including a first read word line to an M-th read word line, N (N is an integer of 1 or more) write bit lines including a first write bit line to an N-th write bit line, N read bit lines including a first read bit line to an N-th read bit line, N source lines including a first source line to an N-th source line, and M×N cells. The M×N cells are arranged in a matrix including M rows×N columns. A cell in an m-th (m is an integer of 1 to M) row×an n-th (n is an integer of 1 to N) column includes a first field effect transistor, a second field effect transistor, and a capacitor. The first field effect transistor is connected to an m-th write word line at a gate, to an n-th write bit line at a drain, and to a source of the second field effect transistor at a source. The second field effect transistor is connected to an m-th read word line at a gate and to an n-th read bit line at a drain. The capacitor is connected to an n-th source line at one end and to the source of the first field effect transistor at the other end.

An arithmetic device 10 according to an embodiment is described below in detail with reference to the accompanying drawings. The arithmetic device 10 according to the embodiment uses a plurality of capacitor type cells and performs a nonlinear operation that simulates neurons. The arithmetic device 10 realizes such a nonlinear operation with a very compact configuration.

Embodiment

Figure 1:
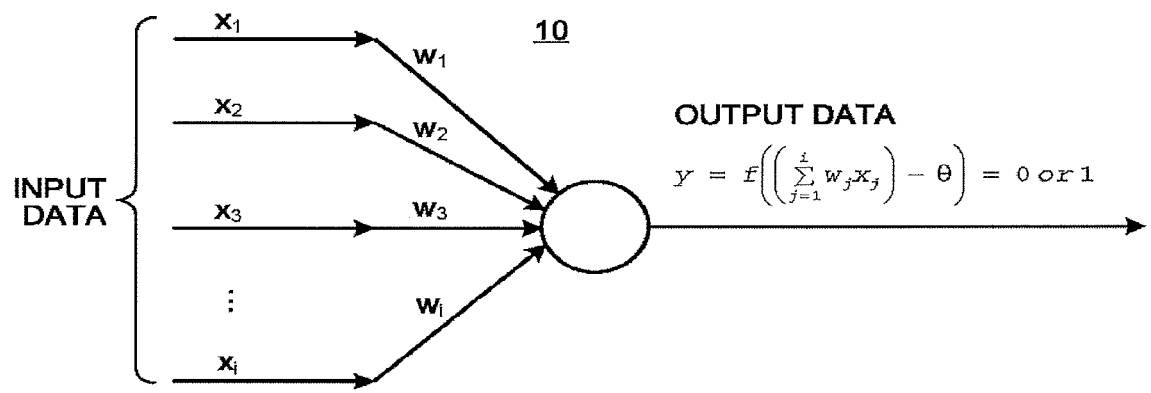
FIG. 1 is a diagram illustrating arithmetic processing by an arithmetic device according to an embodiment.

FIG. 1 is a diagram illustrating arithmetic processing by the arithmetic device 10 according to the embodiment.

The arithmetic device 10 performs a plurality of nonlinear operations simultaneously. The arithmetic device 10 performs the nonlinear operation illustrated in FIG. 1. That is, the arithmetic device 10 stores therein a plurality of weights $w_1$ to $w_i$ (i is an integer of 2 or more) set in advance. The arithmetic device 10 receives a plurality of pieces of input data $x_1$ to $x_i$ and multiplies the pieces of input data $x_1$ to $x_i$ by the corresponding weights $w_1$ to $w_i$, respectively. Subsequently, the arithmetic device 10 adds all pieces of input data $w_1 x_1$ to $w_i x_i$ respectively multiplied by the weights. That is, the arithmetic device 10 performs a product-sum operation for the pieces of input data $x_1$ to $x_i$ and the weights $w_1$ to $w_i$.

Further, the arithmetic device 10 compares a result of the product-sum operation with a threshold value θ set in advance. The arithmetic device 10 outputs 1 as output data y when the result of the product-sum operation is larger than the threshold value θ, and outputs 0 when the result of the product-sum operation is equal to or smaller than the threshold value θ.

This arithmetic device 10 can, for example, perform an operation for one layer in a neural network by performing a set of nonlinear operations. Further, the arithmetic device 10 may repeat the set of nonlinear operations while changing weights. In this manner, the arithmetic device 10 can also perform operations for a plurality of layers in a multilayered neural network.

Figure 2:
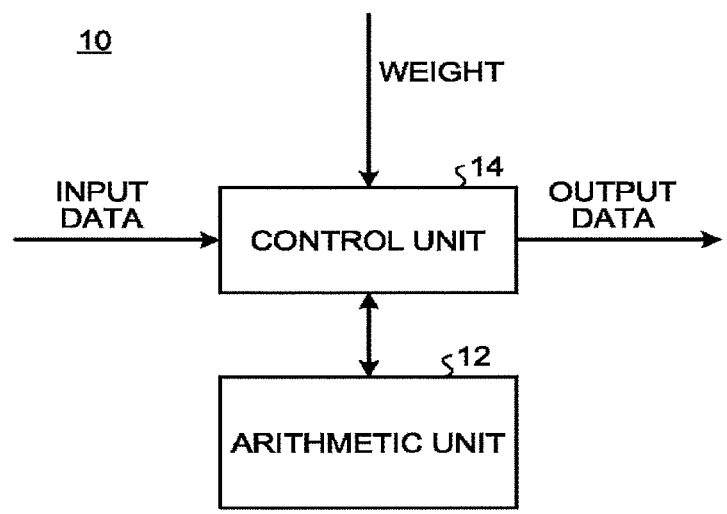
FIG. 2 is a diagram illustrating a block configuration of the arithmetic device.

FIG. 2 is a diagram illustrating a block configuration of the arithmetic device 10. The arithmetic device 10 includes an arithmetic 12 and a control unit 14. The arithmetic unit 12 includes a plurality of capacitor type cells and performs a plurality of nonlinear operations simultaneously.

The control unit 14 receives weights and input data elements. The control unit 14 controls the arithmetic unit 12 in accordance with the received weights and pieces of input data. The control unit 14 outputs a result of operations by the arithmetic unit 12 as output data. The control unit 14 may supply the output data to another device, and the control unit 14 may feed back the output data to the control unit itself as input data.

Figure 3:
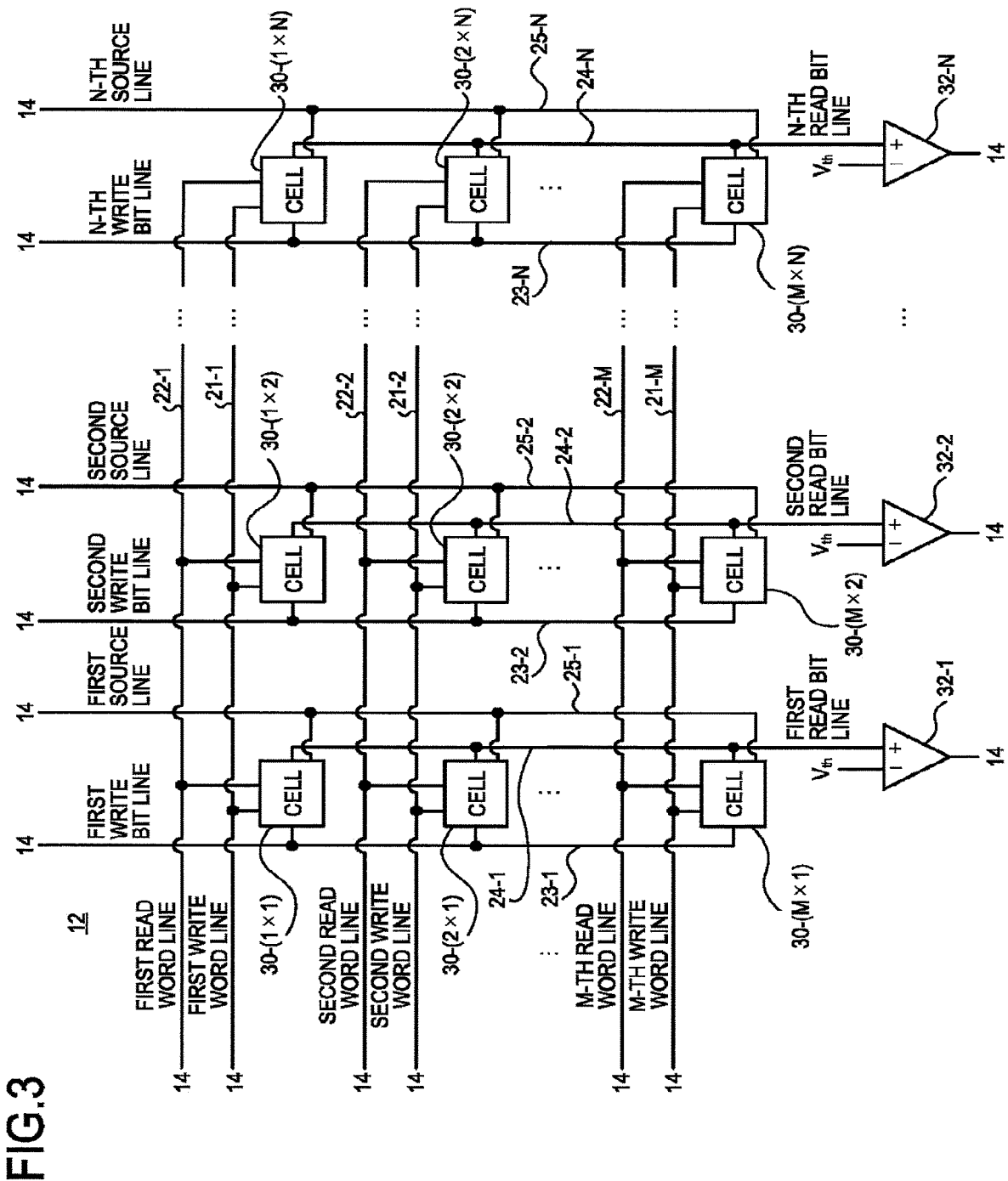
FIG. 3 is a diagram illustrating a configuration of an arithmetic unit.

FIG. 3 is a diagram illustrating a configuration of the arithmetic unit 12. The arithmetic unit 12 includes M (M is an integer of 1 or more) write word lines 21, M read word lines 22, N (N is an integer of 1 or more) write bit lines 23, N read bit lines 24, N source lines 25, M×N cells 30, and N comparators 32.

In the present embodiment, the arithmetic unit 12 includes a first write word line 21-1 to an M-th write word line 21-M as the M write word lines 21. Each of the M write word lines 21 is a wire formed in a semiconductor device, and a voltage is applied thereto by the control unit 14. The M write word lines 21 are arranged in parallel to a first direction.

In the present embodiment, the arithmetic unit 12 includes a first read word line 22-1 to an M-th read word line 22-M as the M read word lines 22. Each of the M read word lines 22 is a wire formed in a semiconductor device, and a voltage is applied thereto by the control unit 14. The M read word lines 22 are arranged in parallel to the first direction.

In the present embodiment, the arithmetic unit 12 includes a first write bit line 23-1 to an N-th write bit line 23-N as the N write bit lines 23. Each of the N write bit lines 23 is a wire formed in a semiconductor device, and a voltage is applied thereto by the control unit 14. The N write bit lines 23 are arranged in parallel to a second direction that is perpendicular to the first direction.

In the present embodiment, the arithmetic unit 12 includes a first read bit line 24-1 to an N-th read bit line 24-N as the N read bit lines 24. Each of the N read bit lines 24 is a wire formed in a semiconductor device. The N read bit lines 24 are arranged in parallel to the second direction.

In the present embodiment, the arithmetic unit 12 includes a first source line 25-1 to an N-th source line 25-N as the N source lines 25. Each of the N source lines 25 is a wire formed in a semiconductor device, and a voltage is applied thereto by the control unit 14. The N source lines 25 are arranged in parallel to the second direction.

For example, the M write word lines 21 and the M read word lines 22 are alternately arranged in the second direction in a semiconductor device. Further, for example, the N write bit lines 23, the N read bit lines 24, and the N source lines 25 are arranged one by one in sequence in the first direction in a semiconductor device.

The M×N cells 30 are arranged in a matrix including M rows×N columns. Each of the M×N cells 30 is formed in a semiconductor device. Each of the M×N cells 30 is the same circuit. A cell 30-($m$×$n$) in an m-th (m is any integer from 1 to M) row×an n-th (n is any integer from 1 to N) column is arranged in the vicinity of an m-th write word line 21-$m$, an m-th read word line 22-$m$, an n-th write bit line 23-$n$, an n-th read bit line 24-$n$, and an n-th source line 25-$n$.

The N comparators 32 are provided to respectively correspond to the N read bit lines 24. In the present embodiment, the arithmetic unit 12 includes a first comparator 32-1 to an N-th comparator 32-N as the N comparators 32.

Each of the N comparators 32 is connected to a corresponding read bit line 24. Each of the N comparators 32 compares whether the voltage of the corresponding read bit line 24 is higher than a threshold voltage $V_{th}$ set in advance. In the present embodiment, an n-th comparator 32-$n$ is connected to the n-th read bit line 24-$n$, and compares whether the voltage of the n-th read bit line 24-$n$ is higher than the threshold voltage $V_{th}$. The threshold voltage $V_{th}$ may be settable for each comparator 32, and may be different for each comparator 32.

In the present embodiment, each of the N comparators 32 outputs a pulse with a predetermined duration at a timing when the voltage of the corresponding read bit line 24 exceeds the threshold voltage $V_{th}$. Each of the N comparators 32 may output 1 when the voltage of the corresponding read bit line 24 is higher than the threshold voltage $V_{th}$, and may output 0 when the voltage of the corresponding read bit line 24 is equal to or lower than the threshold voltage $V_{th}$. Each of the N comparators 32 provides a comparison result to the control unit 14.

Figure 4:
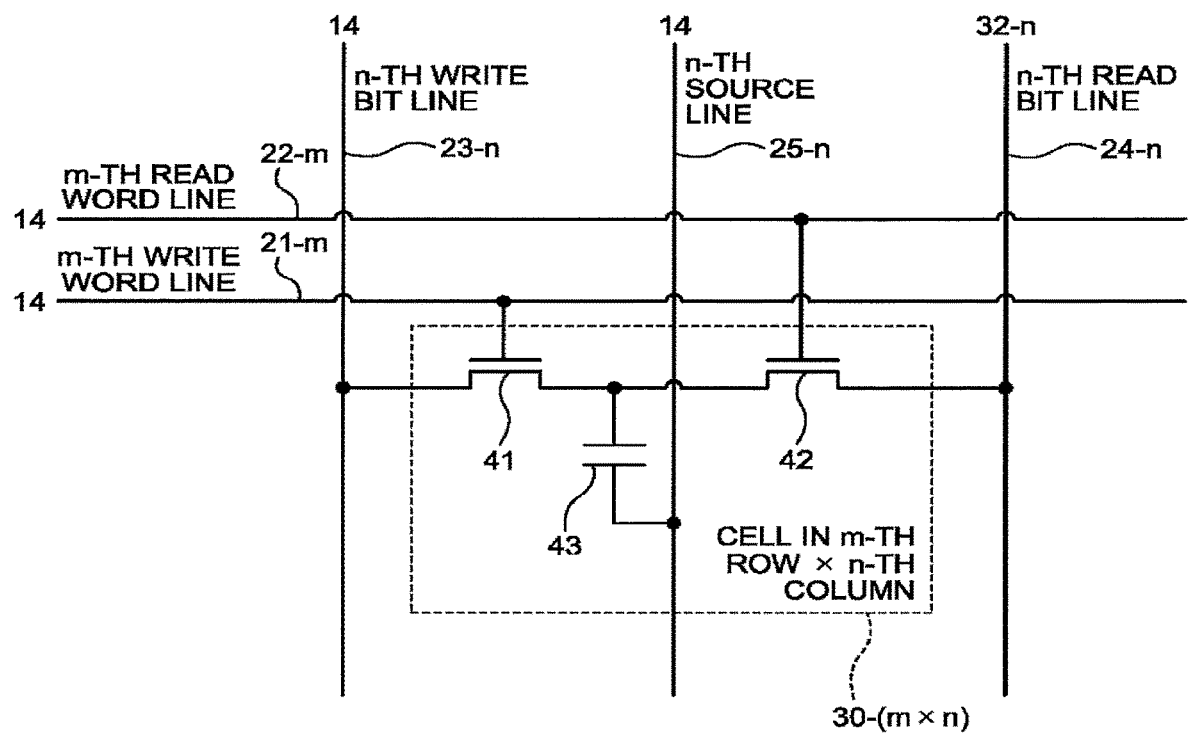
FIG. 4 is a diagram illustrating a configuration of a cell in an m-th row×an n-th column.

FIG. 4 is a diagram illustrating a configuration of the cell 30-($m$×$n$) in the m-th row×the n-th column. Each of the M×N cells 30 includes a first field effect transistor (first FET 41), a second field effect transistor (second FET 42), and a capacitor 43.

The first FET 41 and the second FET 42 are field effect transistors each having a channel formed of an oxide semiconductor. Therefore, a leak current in an off-state is very small in the first FET 41 and the second FET 42.

The first FET 41 of the cell 30-($m$×$n$) in the m-th row×the n-th column is connected to the m-th write word line at a gate, to the n-th write bit line 23-$n$ at a drain, and to a source of the second FET 42 at a source. The second FET 42 of the cell 30-($m$×$n$) in the m-th row×the n-th column is connected to the m-th read word line 22-$m$ at a gate, to the n-th read bit line 24-$n$ at a drain, and the source of the first FET 41 at a source. The capacitor 43 of the cell 30-($m$×$n$) the m-th row×the n-th column is connected to the n-th source line 25-$n$ at one end and to a source of the first FET 41 and the source of the second FET 42 at the other end.

In the first FET 41 of the cell 30-($m$×$n$) in the m-th row×the n-th column, a part between the source and the drain becomes conductive when an on-voltage (a voltage that turns on the first FET 41) is applied to the m-th write word line 21-$m$. Further, in the first FET 41 of the cell 30-($m$×$n$) in the m-th row×the n-th column, the part between the source and the drain becomes non-conductive when an off-voltage (a voltage that turns off the first FET 41) is applied to the m-th write word line 21-$m$.

When the first FET 41 of the cell 30-($m$×$n$) in the m-th row×the n-th column is turned on, the capacitor 43 is charged or discharged in accordance with a potential difference between the n-th write bit line 23-$n$ and the n-th source line 25-$n$. For example, in a case where the voltage of the n-th write bit line 23-$n$ is higher than a voltage obtained by adding the voltage of the capacitor 43 to the voltage of the n-th source line 25-$n$, the capacitor 43 of the cell 30-($m$×$n$)

in the m-th row×the n-th column is charged. In a case where the voltage of the n-th write bit line 23-*n* is lower than the voltage obtained by adding the voltage of the capacitor 43 to the voltage of the n-th source line 25-*n*, the capacitor 43 of the cell 30-(*m*×*n*) in the m-th row×the n-th column is discharged. The amount of charges that are charged to or discharged from the capacitor 43 of the cell 30-(*m*×*n*) in the m-th row×the n-th column is changed by the magnitude and the duration of the voltage applied to the n-th source line 25-*n*.

Therefore, in a case of writing charges corresponding to an input data element to the cell 30-(*m*×*n*) in the m-th row×the n-th column, the control unit 14 applies an on-voltage to the m-th write word line 21-*m* to respectively turn on the first FETs 41 of cells 30-(*m*×1) to 30-(*m*×N) in the m-th row. Further, the control unit 14 applies an off-voltage to the write word lines 21 other than the m-th write word line 21-*m* to respectively turn off the first FETs 41 of the cells 30 other than the cells 30-(*m*×1) to 30-(*m*×*n*) in the m-th row. The control unit 14 then applies a pulse with a voltage and a duration that correspond to the input data element to the n-th write bit line 23-*n*. In this manner, the control unit 14 can write the charges corresponding to the input data element to the capacitor 43 of the cell 30-(*m*×*n*) in the m-th row×the n-th column.

Writing charges to the capacitor 43 includes both a case of charging the capacitor 43 and a case of discharging the capacitor 43. The control unit 14 may open the write bit lines 23 other than the n-th write bit line 23-*n* (make them have a high impedance), in a case of applying the pulse with the voltage and the duration that correspond to the input data element to the n-th write bit line 23-*n*.

The capacitor 43 generates a voltage corresponding to charges accumulated therein. Therefore, the capacitor 43 generates a voltage corresponding to an input data element. Further, the first FET 41 has a small off leak current. Therefore, while the first FET 41 is off, the capacitor 43 continues to keep the charges and does not lower the voltage.

Further, in a state where predetermined charges are accumulated in the capacitor 43, when the first FET 41 is turned on again, the capacitor 43 can further accumulate charges while adding them to the currently accumulated charges. As the control unit 14 writes charges corresponding to an input data element to the capacitor 43 for multiple times, it is possible to cause the capacitor 43 to generate a voltage corresponding to a value obtained by accumulatively adding a plurality of input data elements.

In the second FET 42 of the cell 30-(*m*×*n*) in the m-th row×the n-th column, the part between the source and the drain becomes conductive when an on-voltage (a voltage that turns on the second FET 42) is applied to the m-th read word line 22-*m*. Further, in the second FET 42 of the cell 30-(*m*×*n*) in the m-th row×the n-th column, the part between the source and the drain becomes non-conductive when an off-voltage (a voltage that turns off the second FET 42) is applied to the m-th read word line 22-*m*.

When the second FET 42 of the cell 30-(*m*×*n*) in the m-th row×the n-th column is turned on, the voltage generated by the capacitor 43 is applied to the n-th read bit line 24-*n*. In this manner, when the second FET 42 of the cell 30-(*m*×*n*) in the m-th row×the n-th column is turned on, the n-th comparator 32-*n* connected to the n-th read bit line 24-*n* can compare the threshold voltage $V_{th}$ and the voltage generated by the capacitor 43 of the cell 30-(*m*×*n*) in the m-th row×the n-th column.

Therefore, in a case of reading data corresponding to written charges from the cell 30-(*m*×*n*) in the m-th row×the n-th column, the control unit 14 applies an on-voltage to the m-th read word line 22-*m* to respectively turn on the second FETs 42 of the cells 30-(*m*×1) to 30-(*m*×N) in the m-th row. Further, the control unit 14 applies an off-voltage to the read word lines 22 other than the m-th read word line 22-*m* to respectively turn off the second FETs 42 of the cells 30 other than the cells 30-(*m*×1) to 30-(*m*×N) in the m-th row. The control unit 14 then acquires a comparison result from the n-th comparator 32-*n* of the N comparators 32. In this manner, the control unit 14 can read the charges corresponding to the data written in the capacitor 43 of the cell 30-(*m*×*n*) In the m-th row×the n-th column.

Figure 5:
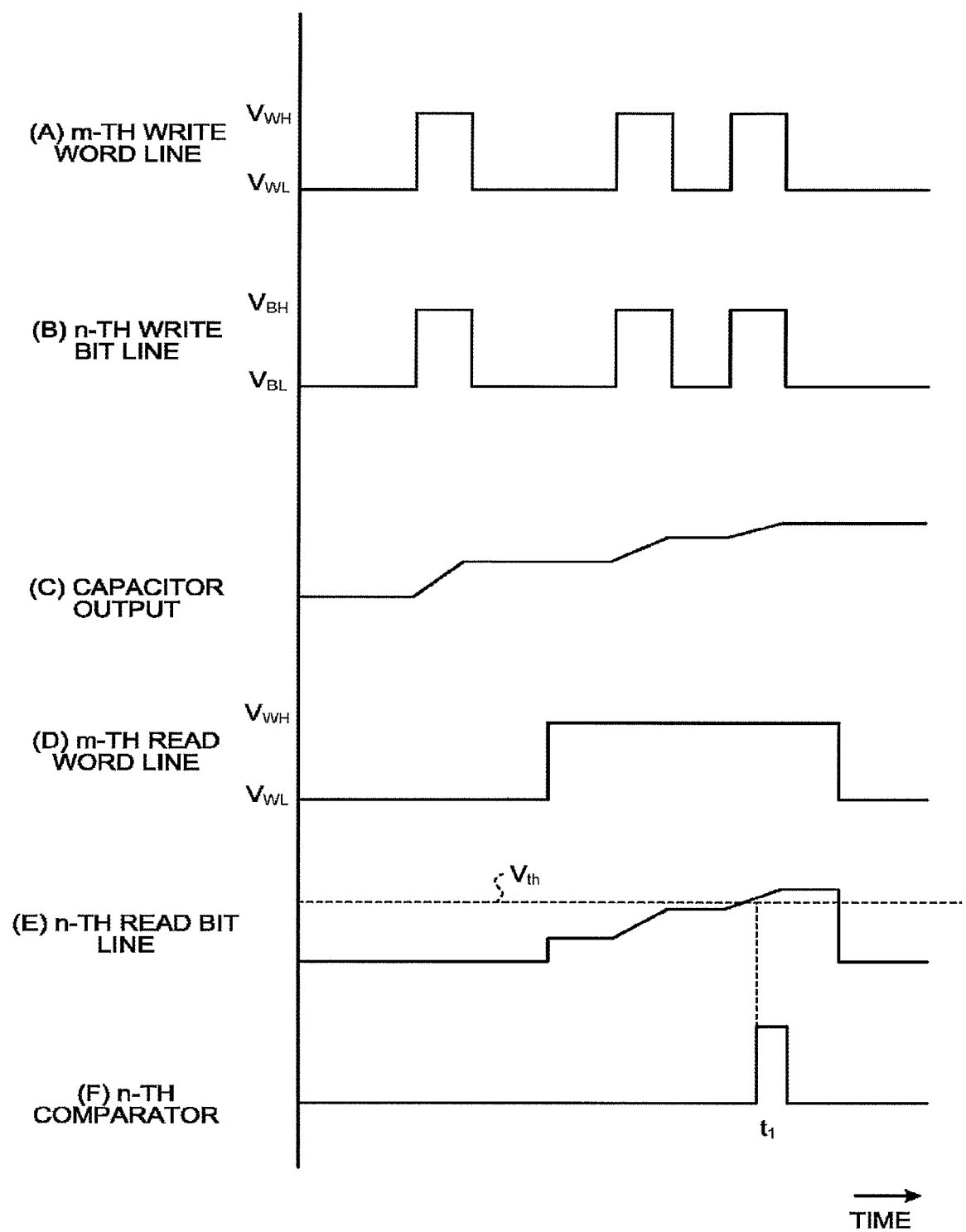
FIG. 5 is a diagram illustrating voltage changes in an arithmetic unit in a case of writing charges to a cell and a case of reading data.

FIG. 5 is a diagram illustrating an example of voltage changes in the arithmetic unit 12 in a case of writing charges to the cell 30-(*m*×*n*) in the m-th row×the n-th column and a case of reading data corresponding to charges accumulated in the cell 30-(*m*×*n*) in the m-th row×the n-th column.

In a case of writing charges to the cell 30-(*m*×*n*) in the m-th row×the n-th column, as illustrated in (A) in FIG. 5, the control unit 14 applies a pulse to the m-th write word line 21-*m*. $V_{WH}$ is an on-voltage of the first FET 41 and the second FET 42. $V_{WL}$ is an off-voltage of the first FET 41 and the second FET 42. These are also applied to the drawings of FIG. 5 and onwards.

Further, in a case of writing charges to the cell 30-(*m*×*n*) in the m-th row×the n-th column, as illustrated in (B) in FIG. 5, the control unit 14 applies a pulse to the n-th write bit line 23-*n*, which is synchronized with the pulse applied to the m-th write word line 21-*m*. A voltage of the pulse applied to the n-th write bit line 23-*n* is $V_{BH}$. $V_{BH}$ is a voltage corresponding to a value obtained by multiplying an input data element by a weight. In a case of writing charges to the cell 30-(*m*×*n*) in the m-th row×the n-th column, the control unit 14 opens the write bit lines 23 other than the n-th write bit line 23-*n* (makes them have a high impedance).

The capacitor 43 of the cell 30-(*m*×*n*) in the m-th row the n-th column is charged when the pulses illustrated in (A) and (B) in FIG. 5 are applied. Therefore, as illustrated in (C) in FIG. 5, the capacitor 43 of the cell 30-(*m*×*n*) in the m-th row×the n-th column generates a voltage corresponding to an integrated value of the applied pulses.

Further, in a case of reading data corresponding to written charges from the cell 30-(*m*×*n*) in the m-th row×the n-th column, as illustrated in (D) in FIG. 5, the control unit 14 applies an on-voltage to the m-th read word line 22-*m*. The timing of application of the on-voltage to the m-th read word line 22-*m* may be asynchronous with the pulse applied to the m-th write word line 21-*m*.

In the n-th read bit line 24-*n*, as illustrated in (E) in FIG. 5, the voltage of the capacitor 43 of the cell 30-(*m*×*n*) in the m-th row×the n-th column is generated in a period in which an on-voltage is applied to the m-th read word line 22-*m*. The n-th comparator 32-*n* generates a pulse at a timing ($t_1$) at which the voltage of the m-th read word line 22-*m* exceeds the threshold voltage $V_{th}$, as illustrated in (F) in FIG. 5.

Figure 6:
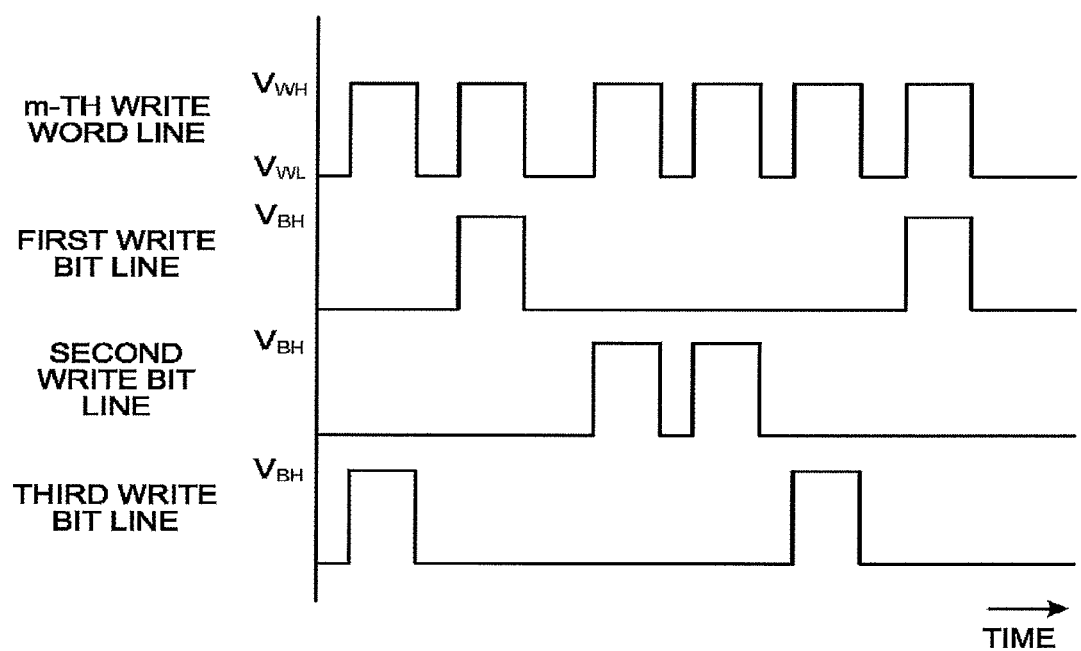
FIG. 6 is a diagram illustrating voltage changes of a write word line at the time of writing.

FIG. 6 is a diagram illustrating an example of voltage changes of the write word line 21 and the write bit lines 23 at the time of writing. In a case of writing charges plurality of cells 30, the control unit 14 selects a cell 30 for which writing is performed in a one-by-one manner. The control unit 14 applies a pulse to a write word line 21 corresponding to the selected cell 30. The control unit 14 also applies a pulse with a voltage corresponding to a value obtained by multiplying an input data element by a weight to a corresponding write bit line 23 in synchronization with the pulse applied to the write word line 21. In this manner, the control unit 14 can charge the selected cell 30 in accordance with the value obtained by multiplying the input data element by the weight.

The control unit 14 then selects a next cell 30 and performs an identical process. Accordingly, the control unit 14 can write charges to the cells 30 in sequence.

The control unit 14 may apply a pulse with a duration corresponding to the value obtained by multiplying an input data element by a weight to each of the corresponding write word line 21 and the corresponding write bit line 23.

When applying a pulse to one write word line 21, the control unit 14 applies an off-voltage to the other write word lines 21. Further, when applying a pulse to the write bit line 23 to which the cell 30 for which writing is performed is connected, the control unit 14 opens the other write bit line 23 (makes it have a high impedance). In this manner, the control unit 14 can eliminate erroneous writing of charges to cells 30 other than the selected cell 30.

Further, the control unit 14 may simultaneously select a plurality of cells 30 connected to the same write word line 21 as cells 30 for which writing is performed. In this case, the control unit 14 applies a pulse to each of a plurality of write bit lines 23 to which the selected cells 30 are respectively connected.

Figure 7:
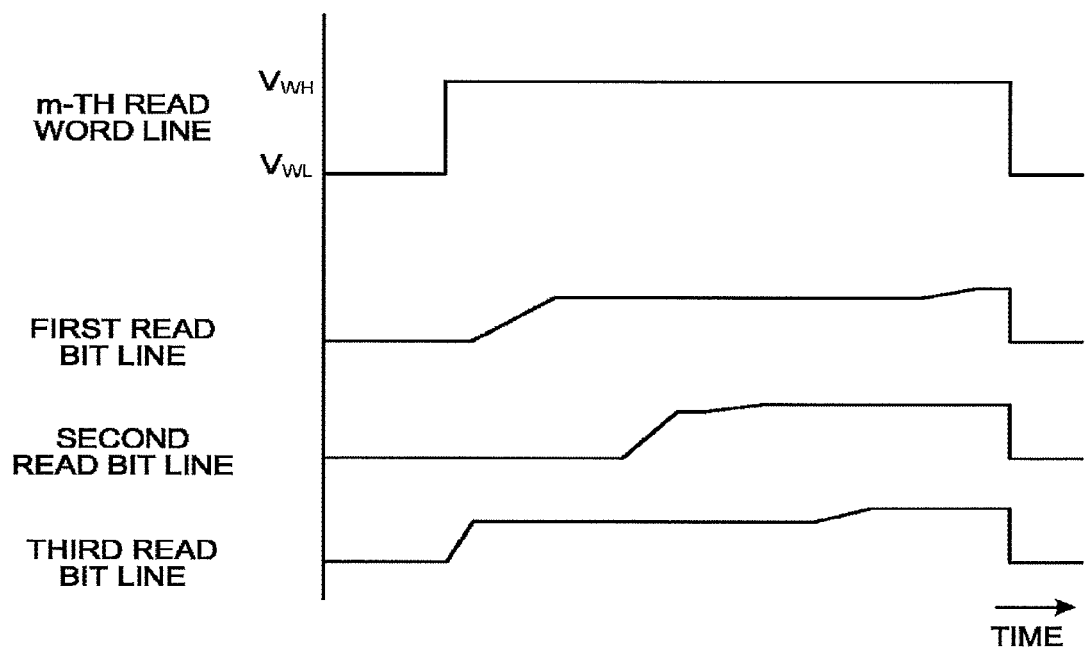
FIG. 7 is a diagram illustrating voltage changes of a read word bit line at the time of reading.

FIG. 7 is a diagram illustrating an example of voltage changes of the read word line 22 and the read bit lines 24 at the time of reading. In a case of reading data corresponding to charges accumulated in the cell 30, the control unit 14 selects a cell 30 for which reading is performed and specifies a read word line 22 including the selected cell 30. The control unit 14 applies an on-voltage to the specified read word line 22.

When an on-voltage is applied to the specified read word line 22, a voltage of the capacitor 43 of the cell 30 connected to a corresponding read bit line 24 and the specified read word line 22 is applied to each of a plurality of read bit lines 24. Therefore, when the on-voltage is applied to one read word line 22, the control unit 14 can read data corresponding to charges accumulated in each of a plurality of cells 30 connected to the specified read word line 22.

When applying an on-voltage to one read word line 22, the control unit 14 applies an off-voltage to the other read word lines 22. In this manner, the control unit 14 can eliminate erroneous writing of charges from the cell 30 connected to the specified read word line 22 to a cell 30 connected to the other read word line 22.

Figure 8:
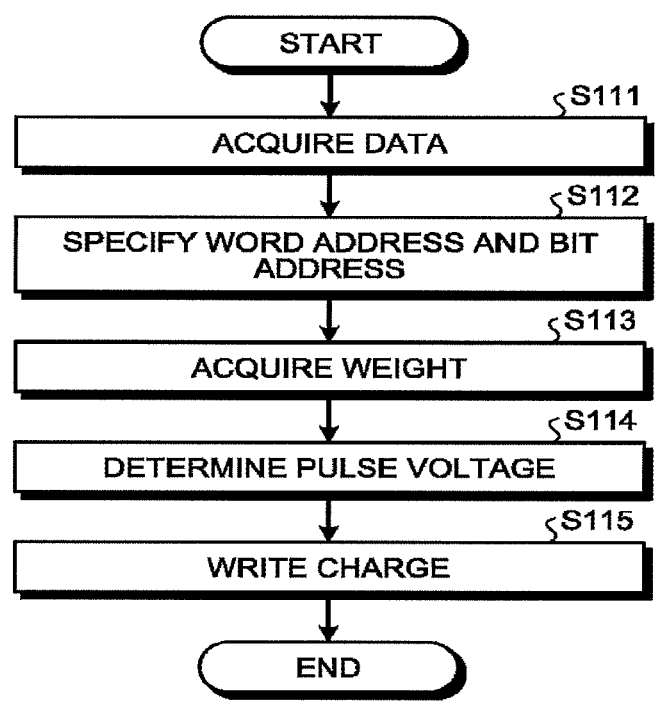
FIG. 8 is a diagram illustrating a flow of processing by a control unit at the time of writing.

FIG. 8 is a diagram illustrating a flow of processing by the control unit 14 at the time of writing. The control unit 14 performs the processing illustrated in FIG. 8 at the time of writing.

First, at S111, the control unit 14 acquires an input data element. Subsequently, at S112, the control unit 14 then specifies a word address and a bit address of a cell 30 to which writing is performed. Thereafter, at S113, the control unit 14 acquires a weight by which the input data is multiplied.

Subsequently, at S114, the control unit 14 determines a pulse voltage to be applied to each of a corresponding write word line 21 and a corresponding write bit line 23. For example, the control unit 14 determines a pulse voltage corresponding to a value that is a result of multiplication of the acquired weight and the input data element. The control unit 14 may determine a duration of a pulse to be applied to each of the corresponding write word line 21 and the corresponding write bit line 23.

Subsequently, at S115, the control unit 14 applies a pulse with a determined voltage to a write word line 21 at the specified word address and a write bit line 23 at the specified bit address. After ending the process at S115, the control unit 14 ends the processing in this flow. In this manner, the control unit 14 can write charges corresponding to an input data element to a corresponding cell 30.

Figure 9:
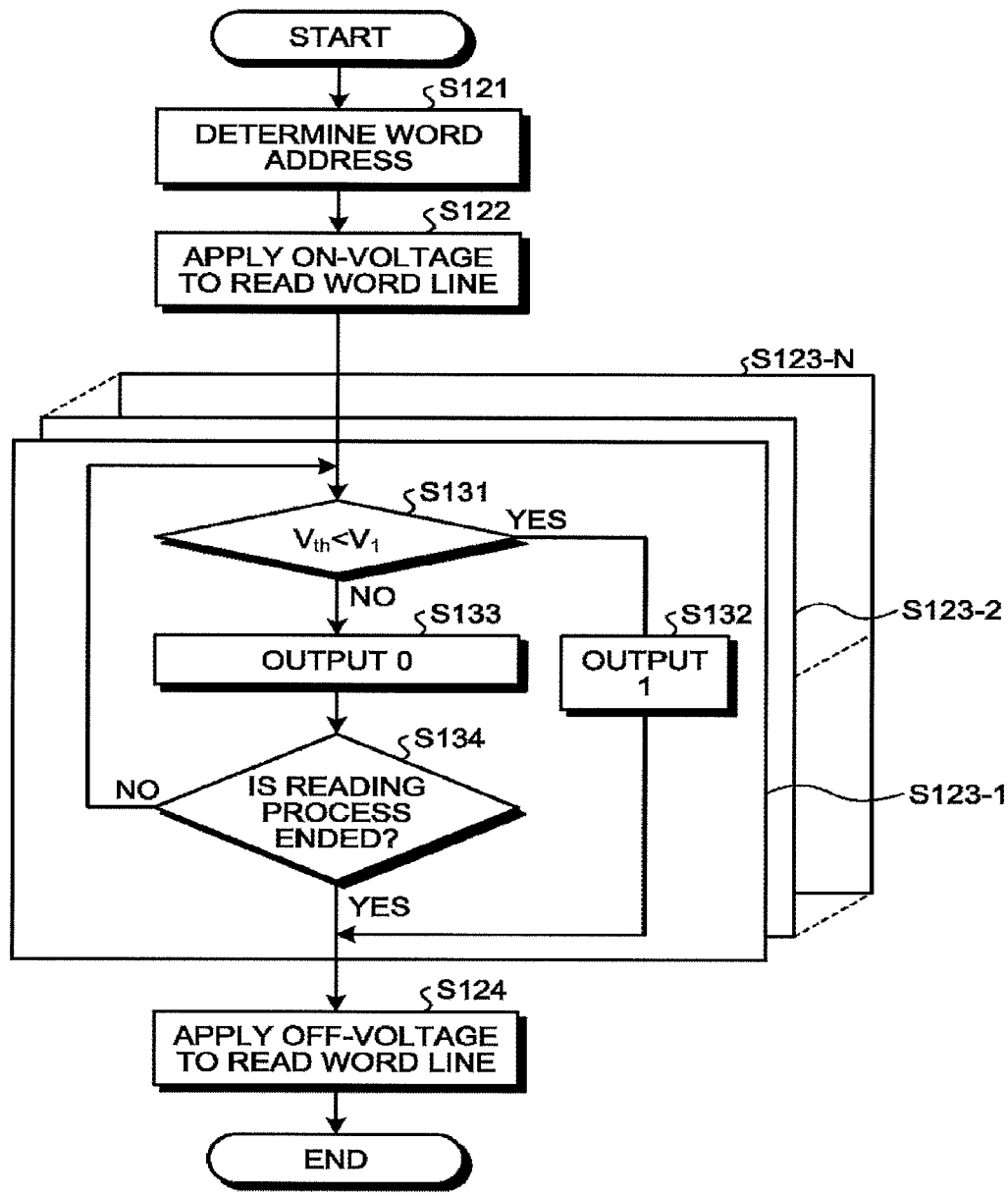
FIG. 9 is a diagram illustrating a flow of processing by the control unit at the time of reading.

FIG. 9 is a diagram illustrating a flow of processing by the control unit 14 at the time of reading. The control unit 14 performs the processing illustrated in FIG. 9 at the time of reading.

First, at S121, the control unit 14 determines a word address of a cell 30 for which reading is performed. Subsequently, at S122, the control unit 14 applies an on-voltage to a read word line 22 at the determined word address.

Subsequently, the control unit 14 performs a process at S123 (S123-1 to S123-N) for each of a plurality of bit addresses simultaneously. At S123, the control unit 14 performs processes at S131 to S134.

At S131, the control unit 14 determines whether a voltage $V_1$ of a corresponding read bit line 24 is larger than the threshold voltage $V_{th}$. Specifically, the control unit 14 determines whether a pulse has been output from a corresponding comparator 32. In a case where the voltage $V_1$ of the corresponding read bit line 24 is larger than the threshold voltage $V_{th}$ (YES at S131), the control unit 14 outputs 1 as output data at S132. After ending the process at S132, the control unit 14 ends the process at S123 and advances the process to S124.

In a case where the voltage $V_1$ of the corresponding read bit line 24 is not larger than the threshold voltage $V_{th}$ (NO at S131), the control unit 14 outputs 0 as output data at S133. Subsequent to S133, at S134, the control unit 14 determines whether to end a reading process. When the reading process is not ended (NO at S134), the control unit 14 returns the process to S131. When the reading process is ended (YES at S134), the control unit 14 ends the process at S123 and advances the process to S124.

At S124, the control unit 14 applies an off-voltage to the read word line 22 at the determined word address. After ending the process at S124, the control unit 14 ends the processing in this flow. In this manner, the control unit 14 can read data corresponding to charges accumulated in the cell 30.

First configuration example when arithmetic device 10 is implemented by semiconductor device Next, a first configuration example of the arithmetic device 10 is described in a case where it is implemented by a semiconductor device.

Figure 10:
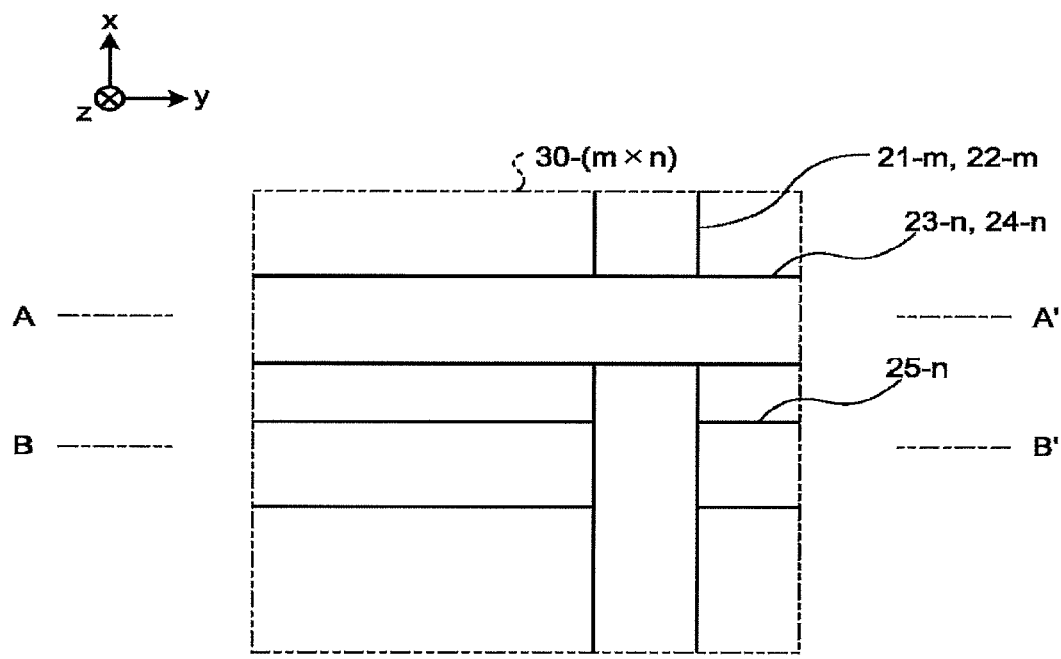
FIG. 10 is a diagram illustrating an arrangement of wires according to a first configuration example as viewed from a z-direction.

FIG. 10 is a diagram illustrating an arrangement of wires in the vicinity of the cell 30-($m \times n$) in the m-th row×the n-th column according to the first configuration example as viewed from a z-direction. In the semiconductor device, it is assumed that the vertical direction (the direction in which films are stacked) is the z-direction (a third direction), an arbitrary direction in a horizontal plane parallel to the films is an x-direction (the first direction), and a direction perpendicular to the x-direction in the plane parallel to the films is a y-direction (the second direction).

The m-th write word line 21-*m* and the m-th read word line 22-*m* are formed of a conductive material such as metal. The m-th write word line 21-*m* and the m-th read word line 22-*m* are formed to be parallel to the x-direction. The m-th write word line 21-*m* and the m-th read word line 22-*m* are formed at positions overlapping each other as viewed from the a-direction (in an x-y plane).

The n-th write bit line 23-*n* and the n-th read bit line 24-*n* are formed of a conductive material such as metal. The n-th write bit line 23-*n* and the n-th read bit line 24-*n* are formed to be parallel to the y-direction. The n-th write bit line 23-*n* and the n-th read bit line 24-*n* are formed at positions overlapping each other as viewed from the z-direction (in the x-y plane).

The n-th source line 25-*n* is formed of a conductive material such as metal. The n-th source line 25-*n* is formed to be parallel to the y-direction. The n-th source line 25-*n* is formed in a region different from the n-th write bit line 23-*n* and the n-th read bit line 24-*n* as viewed from the direction (in the x-y plane).

Figure 11:
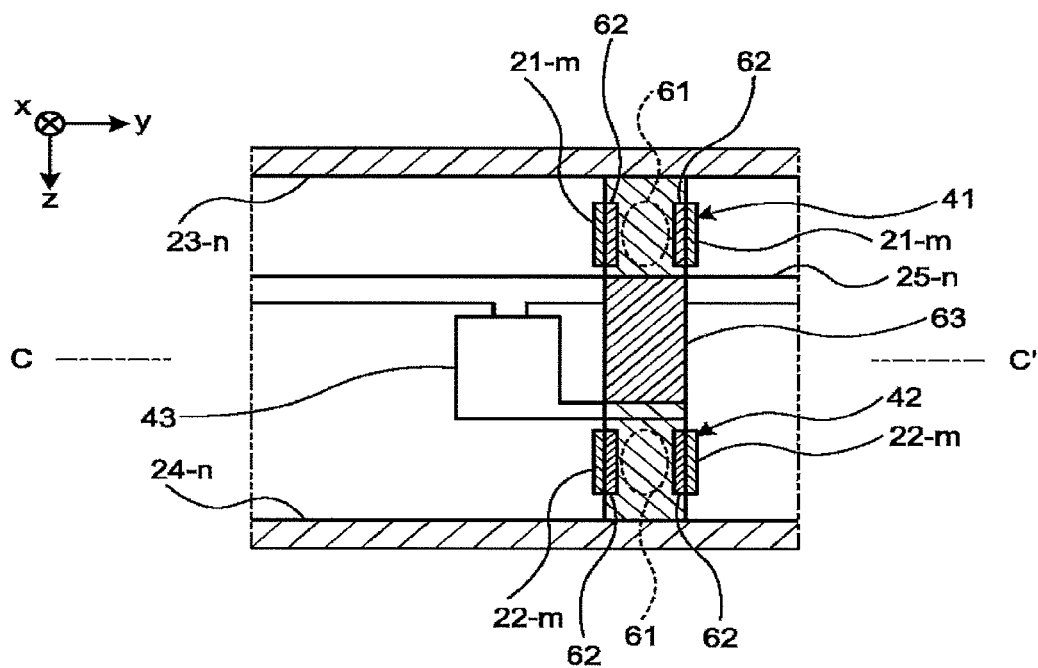
FIG. 11 is a diagram illustrating a cross-section taken along a line A-A' of elements according to the first example.
Figure 12:
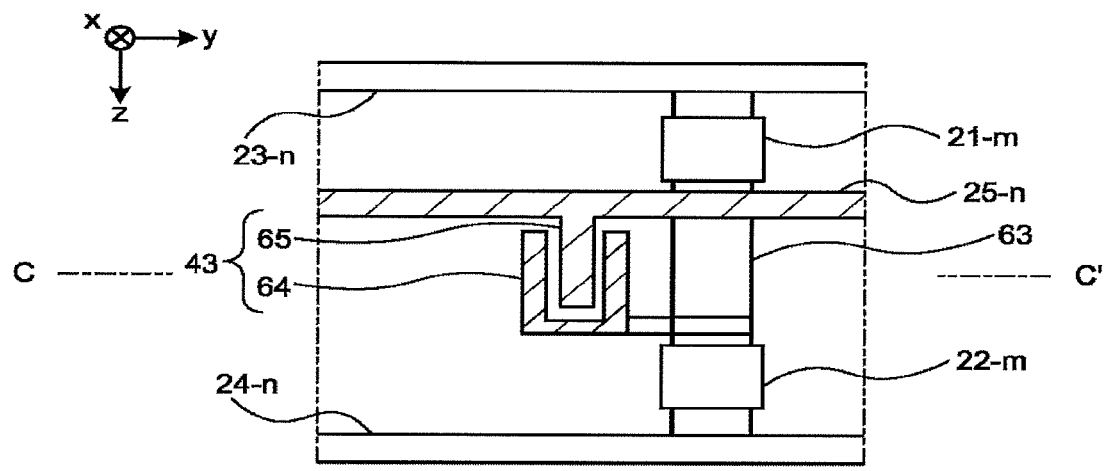
FIG. 12 is a diagram illustrating a cross-section taken along a line B-B' of the elements according to the first example.

FIGS. 11 and 12 are diagrams respectively illustrating an arrangement of elements in the vicinity of the cell 30-(*m*×*n*) in the m-th row×the n-th column according to the first configuration example as viewed from the x-direction. The hatched element in FIG. 11 represents a cross-section taken along a line A-A' in FIG. 10. The hatched element in FIG. 12 represents a cross-section taken along a line B-B' in FIG. 10.

The m-th write word line 21-*m* and the m-th read word line 22-*m* are formed in different layers from each other in the z-direction. The n-th write bit line 23-*n* and the n-th read bit line 24-*n* are formed in different layers from each other in the z-direction.

The m-th write word line 21-*m* and the m-th read word line 22-*m* are formed in a region between the n-th write bit line 23-*n* and the n-th read bit line 24-*n* in the z-direction. The m-th write word line 21-*m* is formed on a side close to the n-th write bit line 23-*n*, and the m-th read word line 22-*m* is formed on a side close to the n-th read bit line 24-*n*. The n-th source line 25-*n* is formed in a region between the m-th write word line 21-*m* and the m-th read word line 22-*m* in the z-direction.

The first FET 41 of the cell 30-(*m*×*n*) in the m-th row the n-th column is formed in a region where the m-th write word line 21-*m* and the n-th write bit line 23-*n* overlap each other as viewed from the z-direction (in the x-y plane). The second FET 42 of the cell 30-(*m*×*n*) in the m-th row×the n-th column is formed in a region where the m-th read word line 22-*m* and the n-th read bit line 24-*n* overlap each other as viewed from the z-direction (in the x-y plane). Each of the first FET 41 and the second FET 42 includes a channel 61 and a gate insulating film 62. For the first FET 41, the m-th write word line 21-*m* functions a gate electrode. For the second FET 42, the m-th read word line 22-*m* functions as a gate electrode.

In the channel 61 of each of the first FET 41 and the second FET 42, a source and a drain are arranged in the direction. That is, in the first FET 41 and the second FET 42, a direction in which charges are caused to flow by the channel 61 is formed along the z-direction (the direction perpendicular to the x-direction (the first direction) and the y-direction (the second direction)).

The channel 61 of the first FET 41 is formed inside through hole extending through the m-th write word line 21-*m* in the z-direction. The gate insulating film 62 is formed between the channel 61 of the first FET 41 and the m-th write word line 21-*m*.

The channel 61 of the second FET 42 is formed inside a through hole extending through the m-th read word line 22-*m* in the z-direction. Further, the gate insulating film 62 is formed between the channel 61 of the second FET 42 and the m-th read word line 22-*m*.

The drain of the first FET 41 is connected to the n-th write bit line 23-*n*. The drain of the second FET 42 is connected to the n-th read bit line 24-*n*. The source of the first FET 41 and the source of the second FET 42 are connected to an interlayer wire 63.

The capacitor 43 of the cell 30-(*m*×*n*) in the m-th row the n-th column includes a trench wall 64 and an electrode portion 65. The trench wall 64 is formed of a conductive material. The trench wall 64 is hollow and tubular. The trench wall 64 is connected to the interlayer wire 63.

The electrode portion 65 is in a shape of a bar inserted into the trench wall 64 and is formed of a conductive material. A dielectric material may be included between the trench wall 64 and the electrode portion 65. The electrode portion 65 is connected the n-th source line 25-*n*.

The capacitor 43 described above is formed between the m-th write word line 21-*m* and the m-th read word line m in the a-direction. Therefore, the capacitor 43 is formed at a position that does not interfere with any of the M write word lines 21, the M read word lines 22, the N write bit lines 23, and the N read bit lines 24 in the z-direction.

Figure 13:
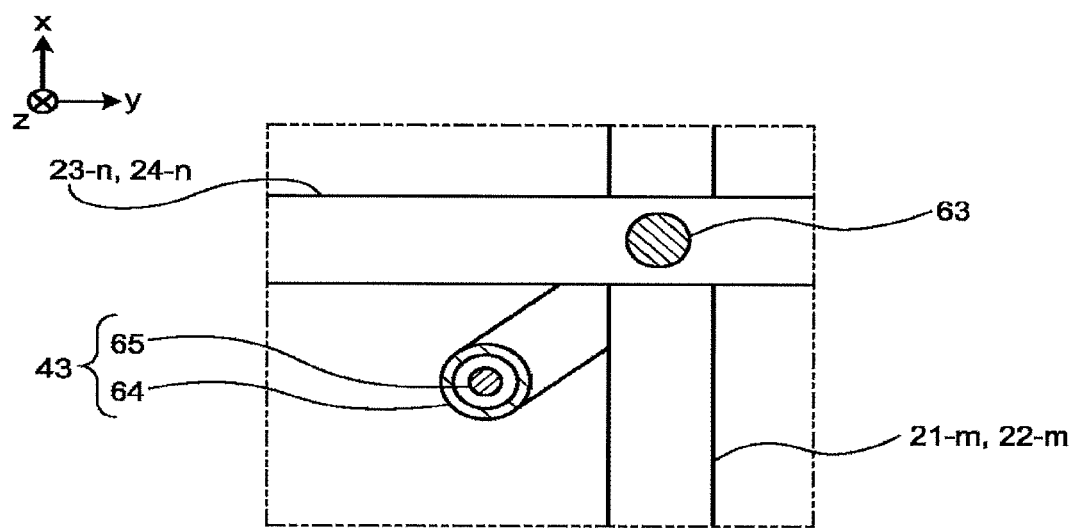
FIG. 13 is a diagram illustrating an arrangement and a cross-section taken along a line C-C' of the elements according to the first example.

FIG. 13 is a diagram illustrating an arrangement of elements in the vicinity of the cell 30-(*m*×*n*) in the m-th row the n-th column according to the first configuration example as viewed from the z-direction. The hatched element in FIG. 13 represents a cross-section taken along a line C-C' in FIGS. 11 and 12.

The capacitor 43 is formed at a position that does not overlap the m-th write word line 21-*m* and the n-th write bit line 23-*n* as viewed from the z-direction (in the x-y plane). Therefore, the capacitor 43 is formed at a position that does not interfere with any of the M write word lines 21, the M read word lines 22, the N write bit lines 23, and the N read bit lines 24 in the x-direction and the y-direction.

With the configuration described above, the arithmetic device 10 can be implemented by a semiconductor device.

The channels 61 of the first FET 41 and the second FET 42 are formed of an oxide semiconductor. The channel 61 can be formed of, for example, an oxide semiconductor containing indium (In), gallium (Ga), and zinc (Zn), which is so-called IGZO. For example, the channel 61 can be formed of a metal oxide semiconductor such as InGaZnO, InSnZnO, InZnO, InGaSnZnO, $In_2O_3$, $Ga_2O_3$, or ZnO.

Second configuration example when arithmetic device 10 is implemented by semiconductor device Next, a second configuration example of the arithmetic device 10 is described in a case where it is implemented by a semiconductor device. The relation among the x-direction (the first direction), the y-direction (the second direction), and the z-direction (the third direction) is identical to that in the first configuration example. Further, constituent elements substantially identical to those in the first configuration example are denoted by like reference characters and detailed descriptions thereof are omitted.

Figure 14:
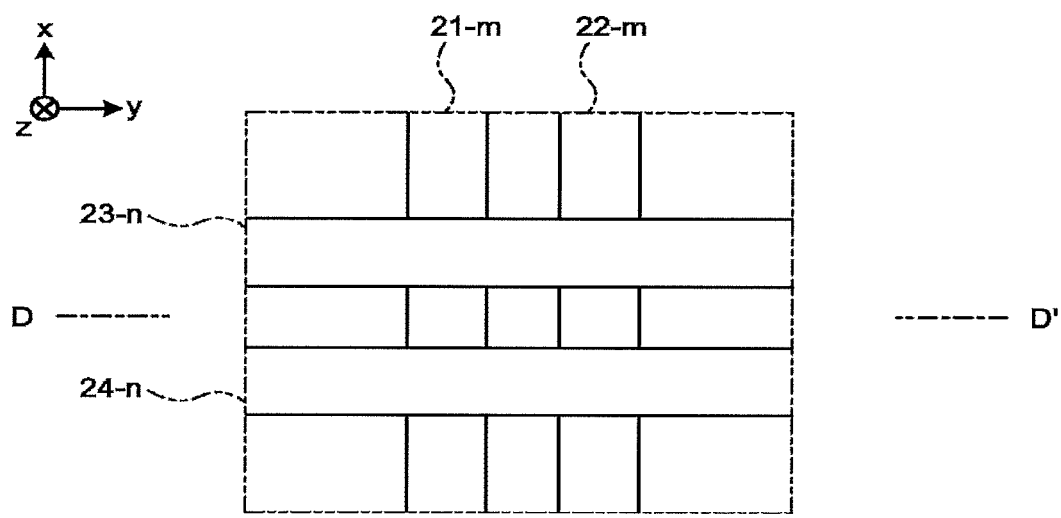
FIG. 14 is a diagram illustrating an arrangement of wires according to a second configuration example as viewed from a z-direction.

FIG. 14 is a diagram illustrating an arrangement of wires in the vicinity of the cell 30-(*m*×*n*) in the m-th row×the n-th column according to the second configuration example as viewed from the z-direction.

The m-th write word line 21-*m* and the m-th read word line 22-*m* are formed to be parallel to the x-direction. The m-th write word line 21-*m* and the m-th read word line 22-*m* are formed in the same layer (in the same x-y plane) as each other.

The n-th write bit line 23-*n* and the n-th read bit line 24-*n* are formed to be parallel to the y-direction. The n-th write bit line 23-*n* and the n-th read bit line 24-*n* are formed in the same layer (in the same x-y plane) as each other. The m-th write word line 21-*m* and the m-th read word line 22-*m* are formed below the n-th write bit line 23-*n* and the n-th read bit line 24-*n*.

Figure 15:
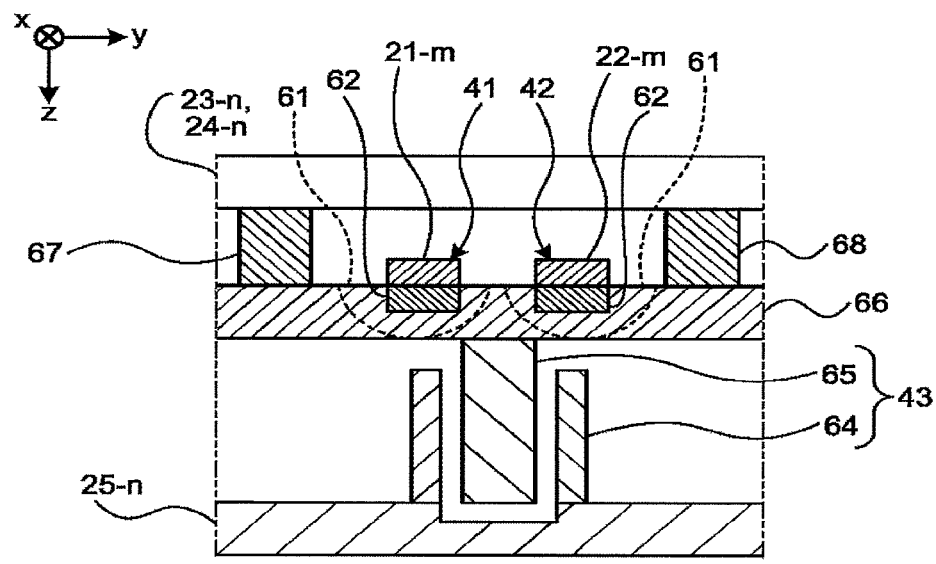
FIG. 15 is a diagram illustrating a cross-section taken along a line D-D' of elements according to the second example.

FIG. 15 is a diagram illustrating an arrangement of elements in the vicinity of the cell 30-(*m*×*n*) in the m-th row×the n-th column according to the second configuration example as viewed from the x-direction. The hatched element in FIG. 15 represents a cross-section taken along a line D-D' in FIG. 14.

The n-th source line 25-$n$ is formed to be parallel to the y-direction. The n-th source line 25-$n$ is formed below the m-th write word line 21-$m$ and the m-th read word line 22-$m$.

An oxide semiconductor layer 66 is formed below the m-th write word line 21-$m$ and the m-th read word line 22-$m$. The channel 61 of the first FET 41 is formed in the oxide semiconductor layer 66 below the m-th write word line 21-$m$. The channel 61 of the second FET 42 is formed in the oxide semiconductor layer 66 below the m-th read word line 22-$m$.

In the channel 61 of each of the first FET 41 and the second FET 42 of the cell 30-($m$×$n$) the m-th row×the n-th column, a source and a drain are arranged in the y-direction. That is, in the first FET 41 and the second FET 42, the direction in which charges are caused to flow by the channel 61 is formed along the y-direction (the second direction).

The gate insulating film 62 is formed between the channel 61 of the first FET 41 and the m-th write word line 21-$m$. The gate insulating film 62 is formed between the channel 61 of the second FET 42 and the m-th read word line 22-$m$. The source of the first FET 41 and the source of the second FET 42 are connected to each other via the oxide semiconductor layer 66.

The drain of the first FET 41 is connected to the n-th write bit line 23-$n$ via a first interlayer wire 67. The drain of the second FET 42 is connected to the n-th read bit line 24-$n$ via a second interlayer wire 68.

The capacitor 43 of the cell 30-(in the m-th row×the n-th column has the trench wall 64 and the electrode portion 65. The trench wall 64 is connected to the n-th source line 25-$n$. The electrode portion 65 is connected to the source of the first FET 41 and the source of the second FET 42.

With the configuration described above, the arithmetic device 10 can be implemented by a semiconductor device including a planar transistor.

As described above, according to the arithmetic device 10 of the present embodiment, it is possible to downscale the configuration of the control unit 14 and to reduce various types of wires by arranging the capacitor-type cells 30 in a matrix. Further, the arithmetic device 10 according to the present embodiment includes the second FET 42 that is turned on at the time of reading of a cell 30, and therefore it is possible to prevent charges from being accidentally written to another cell 30 at the time of reading data.

First Modification

Figure 16:
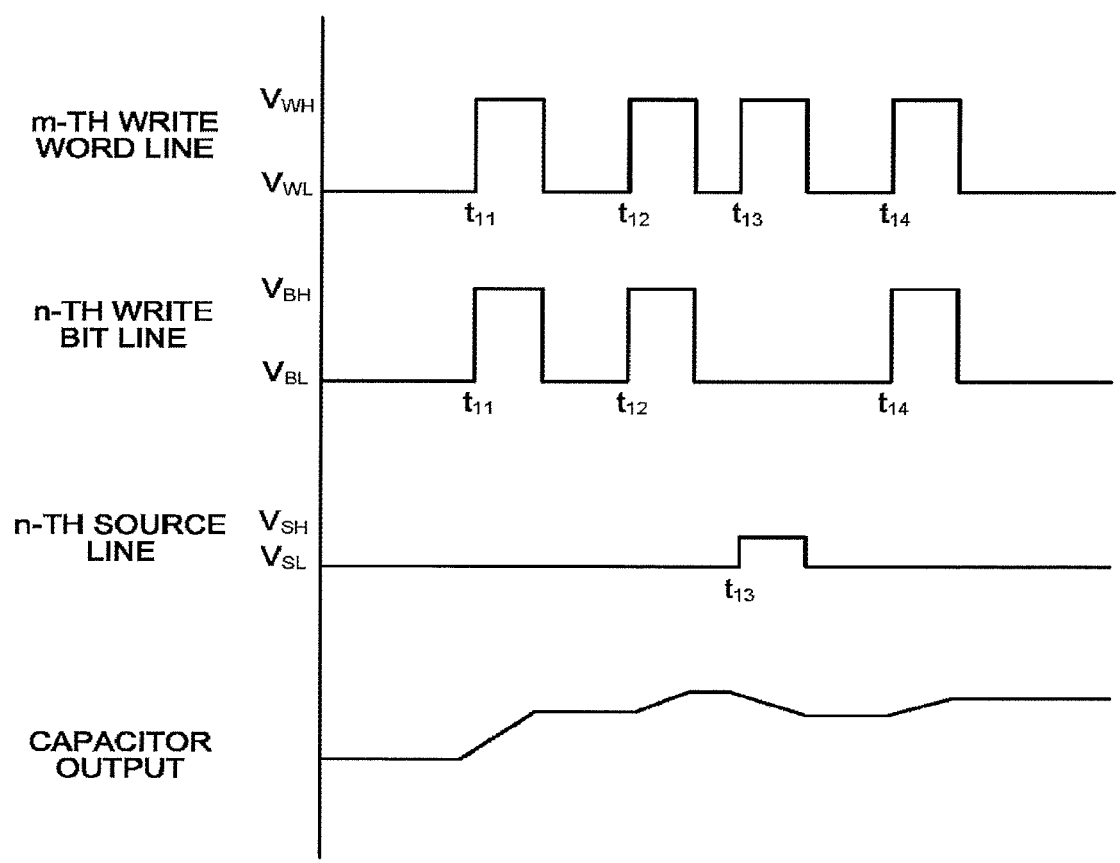
FIG. 16 is a diagram illustrating voltage changes in an arithmetic device according to a first modification.

FIG. 16 is a diagram illustrating an example of voltage changes in the arithmetic device 10 according to a first modification. The control unit 14 according to the first modification controls a voltage relation between a write bit line 23 and a source line 25 at the time of writing of charges to the cells 30.

Specifically, in a case of charging the cell 30-($m$×$n$) in the m-th row×the n-th column, the control unit 14 sets the voltage of the n-th write bit line 23-$n$ with respect to the n-th source line 25-$n$ as a first voltage that is higher than the voltage of the capacitor 43 of the cell 30-($m$×$n$) in the m-th row×the n-th column. In a case of discharging the cell 30-($m$×$n$) the m-th row×the n-th column, the control unit 14 sets the voltage of the n-th write bit line 23-$n$ with respect to the n-th source line 25-$n$ as a second voltage that is equal to or lower than 0 (zero).

For example, in a case of charging the cell 30-($m$×$n$) in the m-th row×the n-th column to raise the voltage of the capacitor 43, the control unit 14 applies pulses to the n-th write bit line 23-$n$ and the m-th write word line 21-$m$, which are synchronized with each other, as indicated at times $t_{11}$, $t_{12}$, and $t_{14}$ in FIG. 16. In this case, the control unit 14 applies a reference voltage $V_{SL}$ for example, a ground voltage or a common voltage) to the n-th source line 25-$n$.

On the other hand, in a case of discharging the cell 30-($m$×$n$) in the m-th row×the n-th column to lower the voltage of the capacitor 43, the control unit 14 applies pulses to the n-th source line 25 and the m-th write word line 21-$m$, which are synchronized with each other, as indicated at a time $t_{13}$ in FIG. 16. At this time, the control unit 14 applies a reference voltage $V_{BL}$ (for example, a ground voltage or a common voltage) to the n-th write bit line 23-$n$. A pulse voltage $V_{SH}$ applied to the n-th source line 25-$n$ is equal to or higher than the reference voltage $V_{BL}$ applied to the n-th write bit line 23-$n$.

In this manner, by controlling a voltage relation between the write bit line 23 and the source line 25, the control unit 14 can charge the cell 30 to raise the voltage of the capacitor 43 of the cell 30 or can discharge the cell 30 to lower the voltage of the capacitor 43.

The control unit 14 may change the voltage to be applied to the source line 25 asynchronously with a pulse applied to the write bit line 23. For example, the control unit 14 may switch the voltage applied to the source line 25 at random. By executing such control, the arithmetic device 10 according to the first modification can easily realize control referred to as "Leaky mode" in a neuromorphic device.

Second Modification

Figure 17:
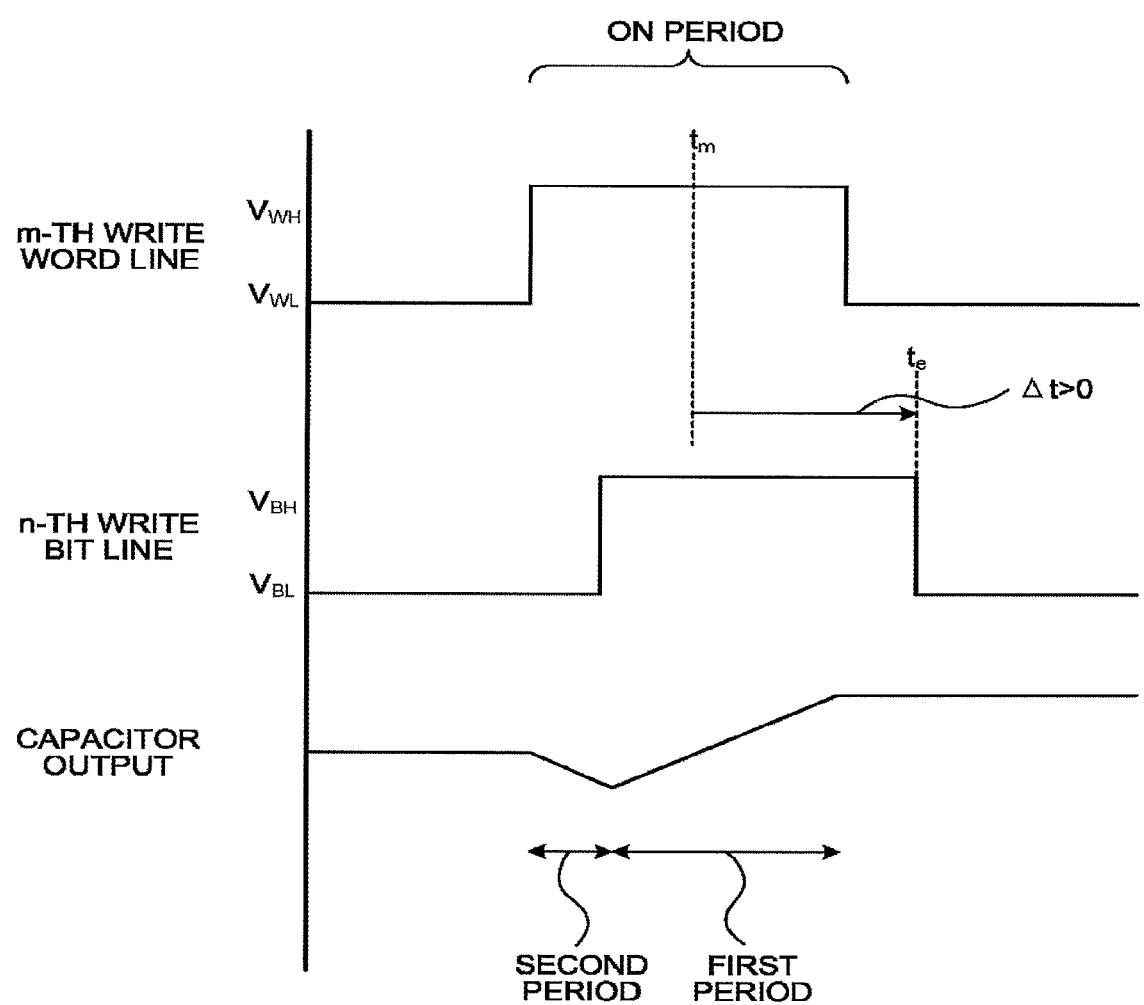
FIG. 17 is a diagram illustrating timings of voltage application when a cell is charged.

FIG. 17 is a diagram illustrating an example of timings of voltage application to the write word line 21 and the write bit line 23 when the cell 30 is charged in the arithmetic device 10 according to a second modification. The control unit 14 according to the second modification controls a phase relation between a pulse applied to the write word line 21 and a pulse applied to the write bit line 23 at the time of writing charges to the cell 30.

In a case of charging the cell 30-($m$×$n$) in the m-th row×the n-th column, the control unit 14 applies a pulse to the n-th write bit line 23-$n$ at a timing that a first period in which a first voltage is applied to the n-th write bit line 23-$n$ is longer than a second period in which a second voltage is applied to the n-th write bit line 23-$n$ in an on-period in which an on-voltage is applied to the m-th write word line 21-$m$. In the first period, charges are accumulated in the capacitor 43 of the cell 30-($m$×$n$) the m-th row×the n-th column. In the second period, the capacitor 43 of the cell 30-($m$×$n$) in the m-th row×the n-th column is discharged. Therefore, in a case where the first period is longer than the second period, the capacitor 43 of the cell 30-($m$×$n$) in the m-th row×the n-th column is charged eventually.

For example, it is assumed that a central time of a pulse applied to the m-th write word line 21-$m$ is $t_m$, and a time of an end edge of a pulse applied to the n-th write bit line 23-$n$ is $t_e$. Assuming that $\Delta t=(t_e-t_m)$, the control unit 14 applies the pulse to the n-th write bit line 23-$n$ at a timing when $\Delta t$ exceeds 0. The duration of the pulse applied to the n-th write bit line 23-$n$ is at least ½ of the pulse applied to the m-th write word line 21-$m$.

Figure 18:
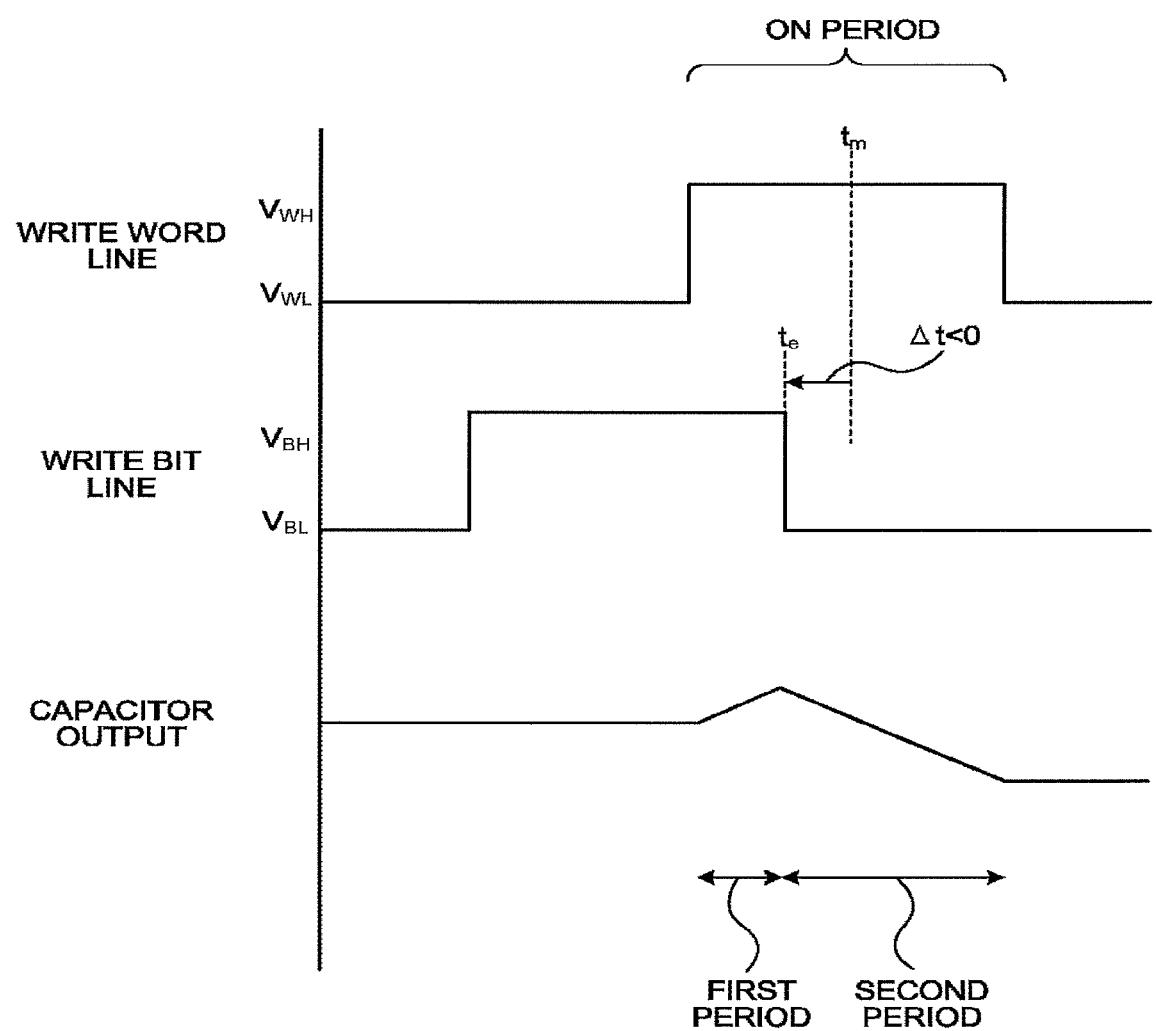
FIG. 18 is a diagram illustrating timings of voltage application when a cell is discharged.

FIG. 18 is a diagram illustrating an example of timings of voltage application to the write word line 21 and the write bit line 23 when the cell 30 is discharged in the arithmetic device 10 according to the second modification.

In a case of discharging the cell 30-($m\times n$) in the n-th row×the n-th column, the control unit 14 applies a pulse to the n-th write bit line 23-$n$ at a timing that the first period in which the first voltage is applied to the n-th write bit line 23-$n$ is shorter than the second period in which the second voltage is applied to the n-th write bit line 23-$n$ in the on-period in which an on-voltage is applied to the m-th write word line 21-$m$. In the first period, charges are accumulated in the capacitor 43 of the cell 30-($m\times n$) in the m-th row×the n-th column. In the second period, the capacitor 43 of the cell 30-($m\times n$) in the m-th row×the n-th column is discharged. Therefore, in a case where the first period is shorter than the second period, the capacitor 43 of the cell 30-($m\times n$) in the m-th row×the n-th column is discharged eventually.

For example, it is assumed that the central time of the pulse applied to the m-th write word line 21-$m$ is $t_m$, and the time of the end edge of the pulse applied to the n-th write bit line 23-$n$ is $t_e$. Assuming that $\Delta t=(t_3\times t_m)$, the control unit 14 applies the pulse to the n-th write bit line 23-$n$ at a timing that $\Delta t$ falls below 0.

In this manner, by controlling a phase relation between the pulse applied to the write word line 21 and the pulse applied to the write bit line 23, the control unit 14 can charge the cell 30 to raise the voltage of the capacitor 43 of the cell 30 or can discharge the cell 30 to lower the voltage of the capacitor 43.

Further, the control unit 14 may change the phase relation between the pulse applied to the write word line 21 and the pulse applied to the write bit line 23 in accordance with a corresponding status. For example, the control unit 14 may switch the phase relation illustrated in FIG. 1 phase relation in charging) and the phase relation illustrated in FIG. 18 (a phase relation in discharging) to each other in accordance with a corresponding status.

For example, the control unit 14 may set the phase relation in charging at initial setting, and may switch it to the phase relation in discharging in accordance with a timing when predetermined data (for example, 1) is read from the cell 30-($m\times n$) in the m-th row×the n-th column. For example, the control unit 14 may switch whether to set the phase relation in charging or the phase relation in discharging in accordance with a time from the start of writing of charges to the cell 30-($m\times n$) in the m-th row×the n-th column to a time at which accumulated charges in the cell 30-($m\times n$) in the m-th row×the n-th column reach a predetermined threshold value.

By executing such control, the arithmetic device it according to the second modification can easily realize control referred to as "STDP (Spike-timing dependent synaptic plasticity)" in a neuromorphic device. For example, in conventional neuromorphic devices, in a case of realizing STOP, it has been necessary to include a separate circuit for generating an input waveform. On the contrary, the arithmetic device 10 according to the second modification is only required to control the phases of pulses respectively applied to the write word line 21 and the write bit line 23. Therefore, it is possible to realize STOP with a small circuit without providing a complicated circuit for generating a waveform.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a control unit configured to receive a plurality of pieces of input data and multiply each of the pieces of input data by a corresponding weight among preset weights; and
   an arithmetic unit, wherein
   the arithmetic unit includes:
   M (M is an integer of 1 or more) write word lines including a first write word line to an M-th write word line;
   M read word lines including a first read word line and an M-th read word line;
   N (N is an integer of 1 or more) write bit lines including a first write bit line to an N-th write bit line;
   N read bit lines including a first read bit line to an N-th read bit line;
   N source lines including a first source line to an N-th source line; and
   M×N cells arranged in a matrix including M rows×N columns, wherein
   a cell in an m-th (m is an integer of 1 to M) row×an n-th (n is an integer of 1 to N) column includes
   a first field effect transistor,
   a second field effect transistor, and
   a capacitor,
   the first field effect transistor is connected to an m-th write word line at a gate, to an n-th write bit line at a drain, and to a source of the second field effect transistor at a source,
   the second field effect transistor is connected to an m-th read word line at a gate and to an n-th read bit line at a drain,
   the capacitor is connected to an n-th source line at one end and to a source of the first field effect transistor at the other end, and
   when the control unit receives a piece of the pieces of input data,
      the control unit is configured to:
         by applying an on-voltage to a write word line corresponding to the piece of input data among the M write word lines, turn on a first field effect transistor included in a cell connected to the corresponding write word line,
         by applying an off-voltage to a write word line other than the corresponding write word line, turn off a first field effect transistor included in a cell other than the cell connected to the corresponding write word line, and
         supply a charge in accordance with a multiplication value obtained by multiplying the piece of input data by the corresponding weight, to a write bit line corresponding to the piece of input data among the N write bit lines.

2. The semiconductor device according to claim 1, wherein
   channels of the first field effect transistor and the second field effect transistor are formed of an oxide semiconductor.

3. The semiconductor device according to claim 2, wherein
channels of the first field effect transistor and the second field effect transistor are formed of an oxide semiconductor containing indium (In), gallium (Ga), and zinc (Zn).

4. The semiconductor device according to claim 1, wherein the control unit is configured to supply one or more pulses of a period in accordance with the multiplication value to the corresponding write bit line among the N write bit lines.

5. The semiconductor device according to claim 4, wherein
when charges are written to the cell in the m-th row×the n-th column, the control unit is configured to:
turn on the first field effect transistor of each of cells in the m-th row by applying an on-voltage to the m-th write word line, and turns off the first field effect transistor of each of cells other than the cells in the m-th row by applying an off-voltage to write word lines other than the m-th write word line, and
apply the one or more pulses to the n-th write bit line.

6. The semiconductor device according to claim 5, further comprising N comparators including a first comparator to an N-th comparator that are provided to respectively correspond to the N read bit lines and compare a voltage of a corresponding read bit line with a threshold voltage set in advance, wherein
when data corresponding to written charges is read from the cell in the m-th row×the n-th column, the control unit is configured to:
turn on the second field effect transistor of each of the cells in the m-th row by applying an on-voltage to the m-th read word line, and turns off the second field effect transistor of each of cells other than the cells in the m-th row by applying an off-voltage to read word lines other than the m-th read word line, and
acquire a result of comparison by an n-th comparator.

7. The semiconductor device according to claim 6, wherein each of the M×N cells accumulates a charge in accordance with one product-sum operation value calculated in one layer in a neuron model; and
the control unit is configured to acquire the result of comparison that is output from each of the N comparators and output the acquired result of comparison as an output value in a layer corresponding to a cell that outputs the result of comparison in a neuron model.

8. The semiconductor device according to claim 5, wherein
when charges corresponding to input data are written to the cell in the m-th row×the n-th column, the control unit is configured to apply a pulse with a voltage corresponding to the input data to the n-th write bit line.

9. The semiconductor device according to claim 5, wherein
when charges corresponding to input data are written to the cell in the m-th row×the n-th column, the control unit is configured to apply a pulse with a duration corresponding to the input data to the n-th write bit line.

10. The semiconductor device according to claim 4, wherein
when the cell in the m-th row×the n-th column is charged, the control unit is configured to set a voltage of the n-th write bit line with respect to the n-th source line as a first voltage higher than a voltage of the capacitor included in the cell in the m-th row×the n-th column, and
when the cell in the m-th row×the n-th column is discharged, the control unit is configured to set the voltage of the n-th write bit line with respect to the n-th source line as a second voltage equal to or lower than 0.

11. The semiconductor device according to claim 10, wherein
when the cell in the m-th row×the n-th column is charged, the control unit is configured to apply applies a pulse to the n-th write bit line at a timing that a first period in which the first voltage is applied to the n-th write bit line is longer than a second period in which the second voltage is applied to the n-th write bit line in an on period in which an on-voltage is applied to the m-th write word line, and
when the cell in the m-th row×the n-th column is discharged, the control unit is configured to apply a pulse to the n-th write bit line at a timing that the first period is shorter than the second period in the on period.

12. The semiconductor device according to claim 1, wherein
the M write word lines and the M read word lines are provided in parallel to a first direction, and
the N write bit lines and the N read bit lines are provided in parallel to a second direction that is perpendicular to the first direction.

13. The semiconductor device according to claim 12, wherein
the N source lines are arranged in parallel to the second direction.

14. The semiconductor device according to claim 12, wherein
in the first field effect transistor and the second field effect transistor, a direction in which charges are caused to flow by a channel is formed along a third direction that is perpendicular to the first direction and the second direction, and
the capacitor is formed at a position not overlapping any of the M write word lines, the M read word lines, the N write bit lines, and the N read bit lines as viewed from any of the first direction, the second direction, and the third direction.

15. The semiconductor device according to claim 14, wherein
the n-th write bit line and the n-th read bit line are formed at positions overlapping each other as viewed from the third direction, and
in each of the first field effect transistor and the second field effect transistor of each of cells in the n-th column, a channel is formed in a region between the n-th write bit line and the n-th read bit line in the third direction.

16. The semiconductor device according to claim 1, wherein each of the M×N cells accumulates a charge in accordance with one product-sum operation value calculated in one layer in a neuron model.

17. A semiconductor device comprising:
a control unit configured to receive input data and multiply the received input data by a preset weight; and
an arithmetic unit, wherein
the arithmetic unit includes:
a write word line;
a read word line;
a write bit line;
a read bit line;
a source line; and
a cell including a first field effect transistor, a second field effect transistor, and a capacitor, wherein the first field effect transistor is connected to the write word line at a gate, to the write bit line at a drain, and to a source of the second field effect transistor at a source, the second field effect transistor is connected to the read word line at a gate and to the read bit line at a drain, the capacitor is connected to the source line at one end and to a source of the first field effect transistor at the other end, and when the control unit receives the input data, the control unit is configured to:
- by applying an on-voltage to the write word line, turn on the first field effect transistor, and
- supply a charge in accordance with a multiplication value obtained by multiplying the input data by the weight, to a write bit line corresponding to the input data.

18. The semiconductor device according to claim 17, wherein
channels of the first field effect transistor and the second field effect transistor are formed of an oxide semiconductor.

19. The semiconductor device according to claim 18, wherein channels of the first field effect transistor and the second field effect transistor are formed of an oxide semiconductor containing indium (In), gallium (Ga), and zinc (Zn).

* * * * *